(12) United States Patent
Voo

(10) Patent No.: US 7,545,219 B1
(45) Date of Patent: *Jun. 9, 2009

(54) OPEN LOOP DC CONTROL FOR A TRANSIMPEDANCE FEEDBACK AMPLIFIER

(75) Inventor: Thart Fah Voo, Singapore (SG)

(73) Assignee: Marvell International Ltd. (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/174,882

(22) Filed: Jul. 17, 2008

Related U.S. Application Data

(63) Continuation of application No. 11/206,384, filed on Aug. 17, 2005.

(51) Int. Cl.
*H03F 3/04* (2006.01)

(52) U.S. Cl. ..................... 330/296
(58) Field of Classification Search .............. None
See application file for complete search history.

(56) References Cited

U.S. PATENT DOCUMENTS

| | | | | |
|---|---|---|---|---|
| 5,030,925 | A * | 7/1991 | Taylor | 330/308 |
| 5,087,892 | A * | 2/1992 | Hayashi | 330/296 |
| 5,929,759 | A * | 7/1999 | Charrier | 340/555 |
| 6,218,905 | B1 * | 4/2001 | Sanders et al. | 330/308 |
| 6,552,324 | B1 * | 4/2003 | Kothari et al. | 250/214 A |
| 6,876,260 | B2 * | 4/2005 | Visocchi | 330/308 |

* cited by examiner

*Primary Examiner*—Benny Lee
*Assistant Examiner*—Krista M Flanagan

(57) ABSTRACT

A transimpedance amplifier having open-loop DC control is provided. The open-loop feedback control may provide a DC bias that is configurable based on the characteristics of an input device, such as, a photodiode or a magnetoresistor. The open-loop feedback control may provide quick recovery from voltage level variations and may provide stability for the amplifier.

20 Claims, 4 Drawing Sheets

OPEN LOOP DC CONTROL FOR A TRANSIMPEDANCE FEEDBACK AMPLIFIER

CROSS REFERENCE TO RELATED APPLICATIONS

This is a continuation of copending, commonly-assigned U.S. patent application Ser. No. 11/206,384, filed Aug. 17, 2005, which is hereby incorporated herein by reference in its entirety.

BACKGROUND OF THE INVENTION

This invention relates to a transimpedance amplifier having open-loop DC control.

Transimpedance amplifiers, also commonly referred to as current-to-voltage converters, are frequently used to amplify input signals from sensors, such as, a photodiodes or a magnetoresistors. Transimpedance amplifiers provide high gain while also providing fast response times. The transimpedance amplifier must be properly DC biased to maintain the sensor biased at a proper DC operating level.

A feedback amplifier may be necessary to maintain the DC levels of the transimpedance amplifier at an appropriate voltage level. Closed-loop feedback amplifiers are often used to maintain the DC voltage levels, however, closed-loop feedback amplifiers may be prone to feedback delays or instability.

In view of the forgoing, it would be desirable to provide a transimpedance amplifier having open-loop DC control.

SUMMARY OF THE INVENTION

These and other objects of the invention are provided by a transimpedance feedback amplifier having open-loop DC control.

The open-loop feedback control may provide a DC bias that is configurable based on the characteristics of the input device. The open-loop feedback control may provide quick recovery from voltage level variations and may provide stability for the amplifier.

Further features of the invention, its nature and various advantages, will be more apparent from the accompanying drawings and the following detailed description of the preferred embodiments.

DETAILED DESCRIPTION

Figure 1:
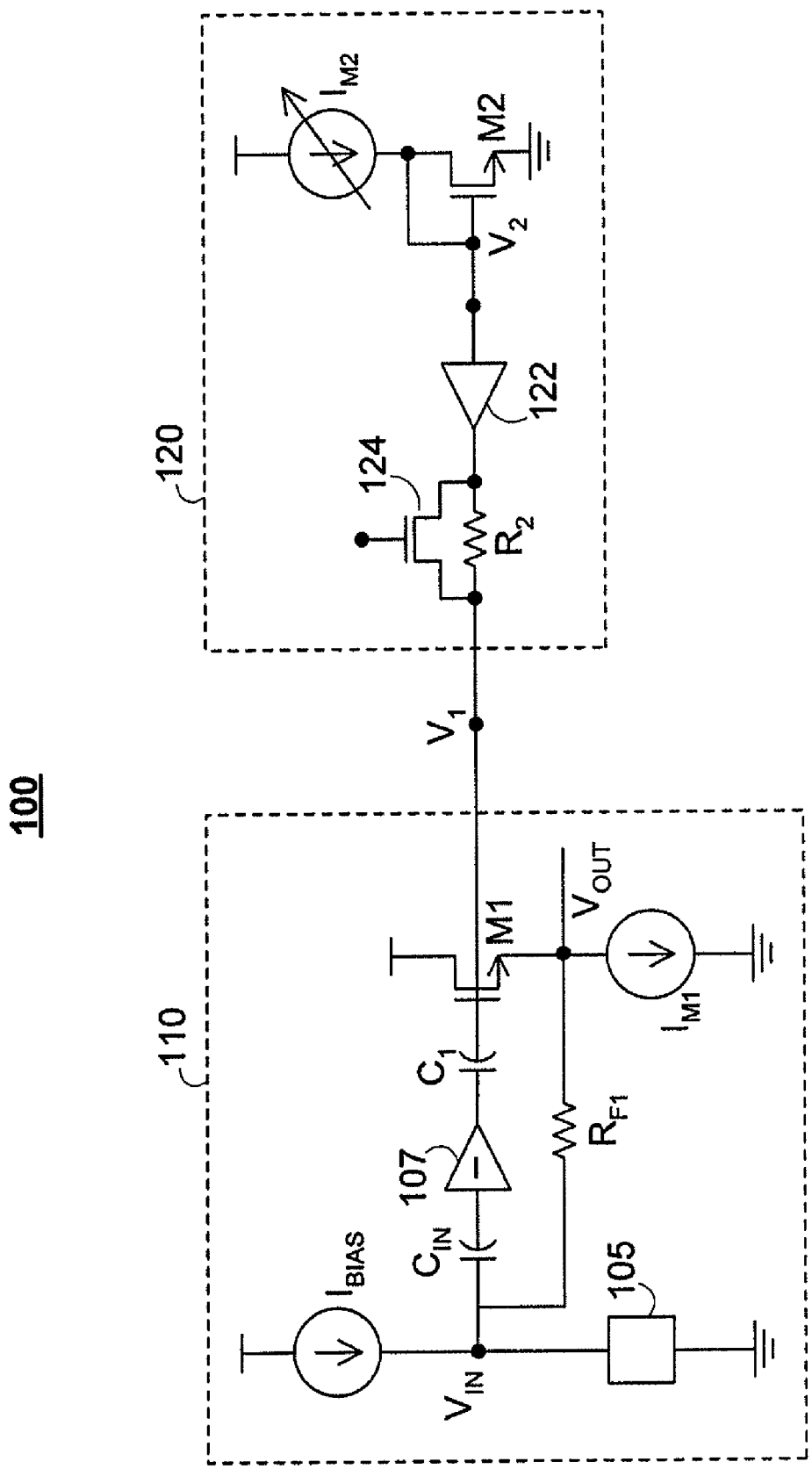
FIG. 1 shows a simplified diagram of a transimpedance feedback amplifier having open-loop DC control in accordance with some aspects of the present invention.

FIG. 1 shows transimpedance feedback amplifier 100 with open-loop DC control in accordance with some aspects of the present invention. Transimpedance feedback amplifier 100 contains amplifier stage 110 and open-loop DC control stage 120. Amplifier stage 110 is AC coupled to $V_{IN}$, the output of input device 105, which may be biased by bias current $I_{BIAS}$. Input device 105 may be, for example, a photodiode or a magnetoresistor. AC coupling input capacitor $C_{IN}$ is connected to $V_{IN}$ and amplifier 107. The output of amplifier 107 is connected to series capacitor $C_1$. In some embodiments of the present invention, $C_1$ may be a small capacitor (e.g., approximately five picofarads). The gate of transistor M1 is connected to the output of series capacitor $C_1$. The drain of transistor $M_1$ is connected to the power supply $V_{DD}$. Current source $I_{M1}$ is connected between the source of transistor M1 and ground. The source of transistor $M_1$ also provides DC feedback to input node $V_{IN}$ through feedback resistor $R_F$. In the present embodiment of the invention, the output of transimpedance feedback amplifier 100, $V_{OUT}$ may be taken from the source of transistor $M_1$. Alternatively, the output voltage may be taken from node $V_1$. While in the present embodiment MOS transistors are used, it should be understood that BJT transistors may also be used in accordance with the present invention.

During operation of transimpedance feedback amplifier 100, amplifier stage 110 amplifies the high-frequency components of the input signal $V_{IN}$. The low-frequency cutoff of the amplifier is set by the capacitances of capacitors $C_{IN}$ and $C_1$, the input impedance of amplifier 107, and the resistance of resistor $R_2$.

Open-loop DC control stage 120 is DC coupled to the gate voltage of transistor M1. Open-loop DC control stage 120 contains resistor $R_2$, transistor M2, voltage buffer 122, switch 124, and variable current source $I_{M2}$. The gate-source voltages of transistors M1 and M2 may be substantially equal when the magnitudes of $I_{M1}$ and M1 are in proportion to the magnitudes $I_{M2}$ and M2. For example, the magnitudes of $I_{M1}$ and M1 may be a tenth of the magnitude of $I_{M2}$ and M2. Because open-loop DC control stage 120 does not receive feedback from amplifier stage 110, DC control stage 120 may be very stable and may recover quickly from variations in the DC voltage level.

After transimpedance feedback amplifier 100 is properly biased, the DC voltage level of $V_{IN}$ is approximately equal to the DC voltage level of $V_{OUT}$ and the current flowing through feedback resistor $R_F$ is minimized. The current generated by current source $I_{M2}$ may be adjusted to change the DC voltage level of $V_{OUT}$ in order to set $V_{OUT}$ approximately equal to any suitable DC voltage level of $V_{IN}$.

Voltage buffer 122 may allow voltage $V_2$ to drive capacitor $C_1$ through resistor $R_2$. During fast switching of transimpedance feedback amplifier 100 a control signal (not shown) may cause switch 124 to short-circuit resistor $R_2$, which may allow voltage buffer 122 to directly drive capacitor $C_1$ to quickly charge the capacitor. For example, when transimpedance amplifier 100 is turned on, capacitor $C_1$ needs to be charged to an appropriate DC voltage level before the circuit can operate properly.

Figure 2:
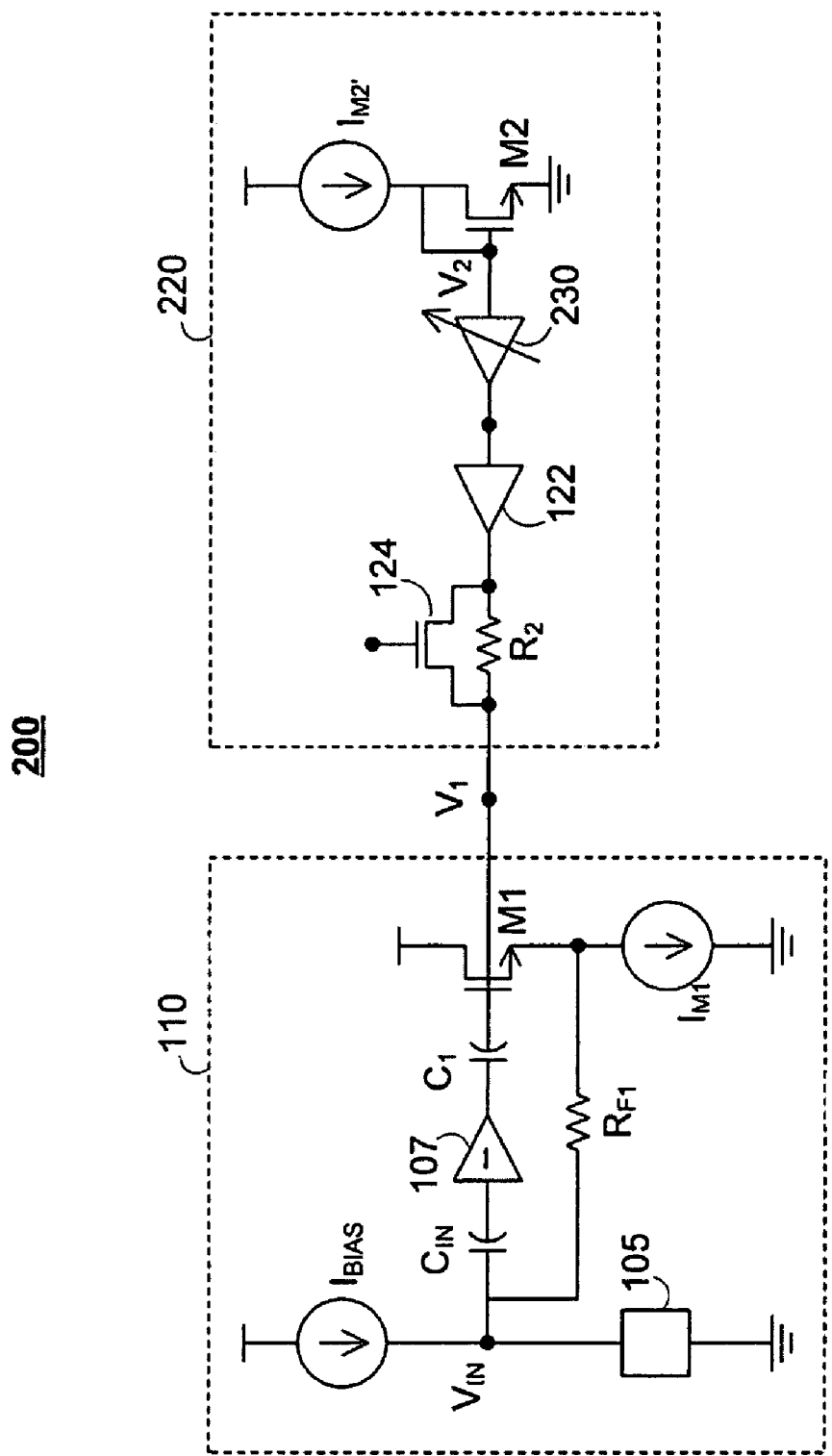
FIG. 2 shows a simplified diagram of another transimpedance feedback amplifier having open-loop DC control in accordance with some aspects of the present invention.

FIG. 2 shows transimpedance feedback amplifier 200 in accordance with some aspects of the present invention. Transimpedance feedback amplifier 200 operates in a similar manner as transimpedance feedback amplifier 100. Transimpedance feedback amplifier 200 uses constant current source $I_{M2'}$ in addition to programmable offset amplifier 230, within open-loop DC control stage 220 to adjust the DC voltage level instead of using variable current source $I_{M2}$. Programmable offset amplifier 230 may be set to provide and offset voltage approximately equal to the DC voltage level of $V_{IN}$. Programmable offset amplifier 230 allows $V_{OUT}$ to be set to approximately the same voltage level as $V_{IN}$.

Figure 3:
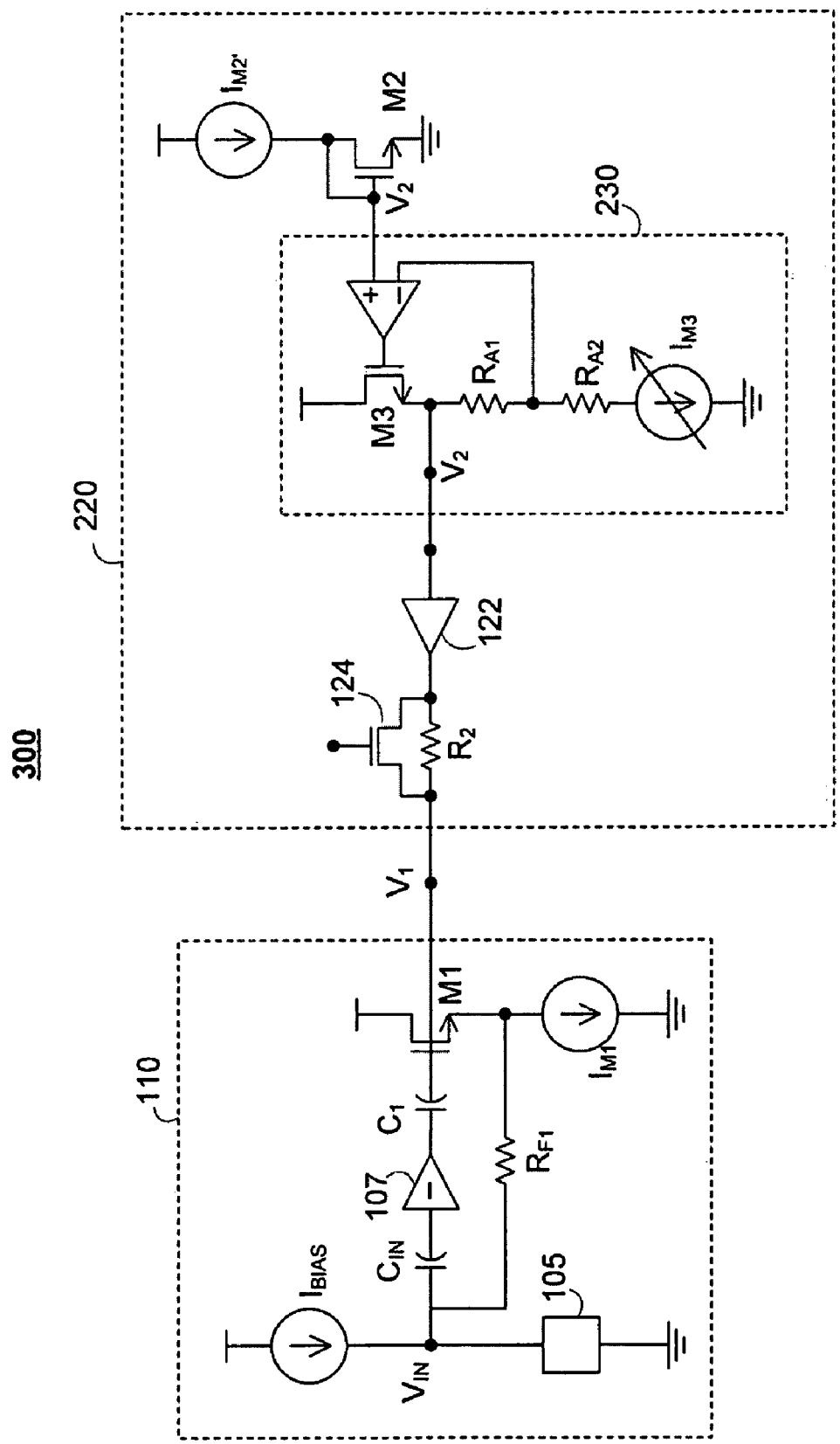
FIG. 3 shows a more detailed simplified diagram of a transimpedance feedback amplifier having open-loop DC control in accordance with some aspects of the present invention.

FIG. 3 shows transimpedance feedback amplifier 300 including a more detailed embodiment of programmable offset amplifier 230. Programmable offset amplifier 230 contains an amplifier, transistor M3, resistors $R_{A1}$ and $R_{A2}$, and variable current source $I_{M3}$. The offset voltage of programmable offset amplifier 230 may be adjusted by variable current source $I_{M3}$. Adjusting variable current source $I_{M3}$ based on the characteristics of input device 105 may permit open-loop DC control stage 220 to maintain proper DC bias of transimpedance feedback amplifier 200.

Figure 4:
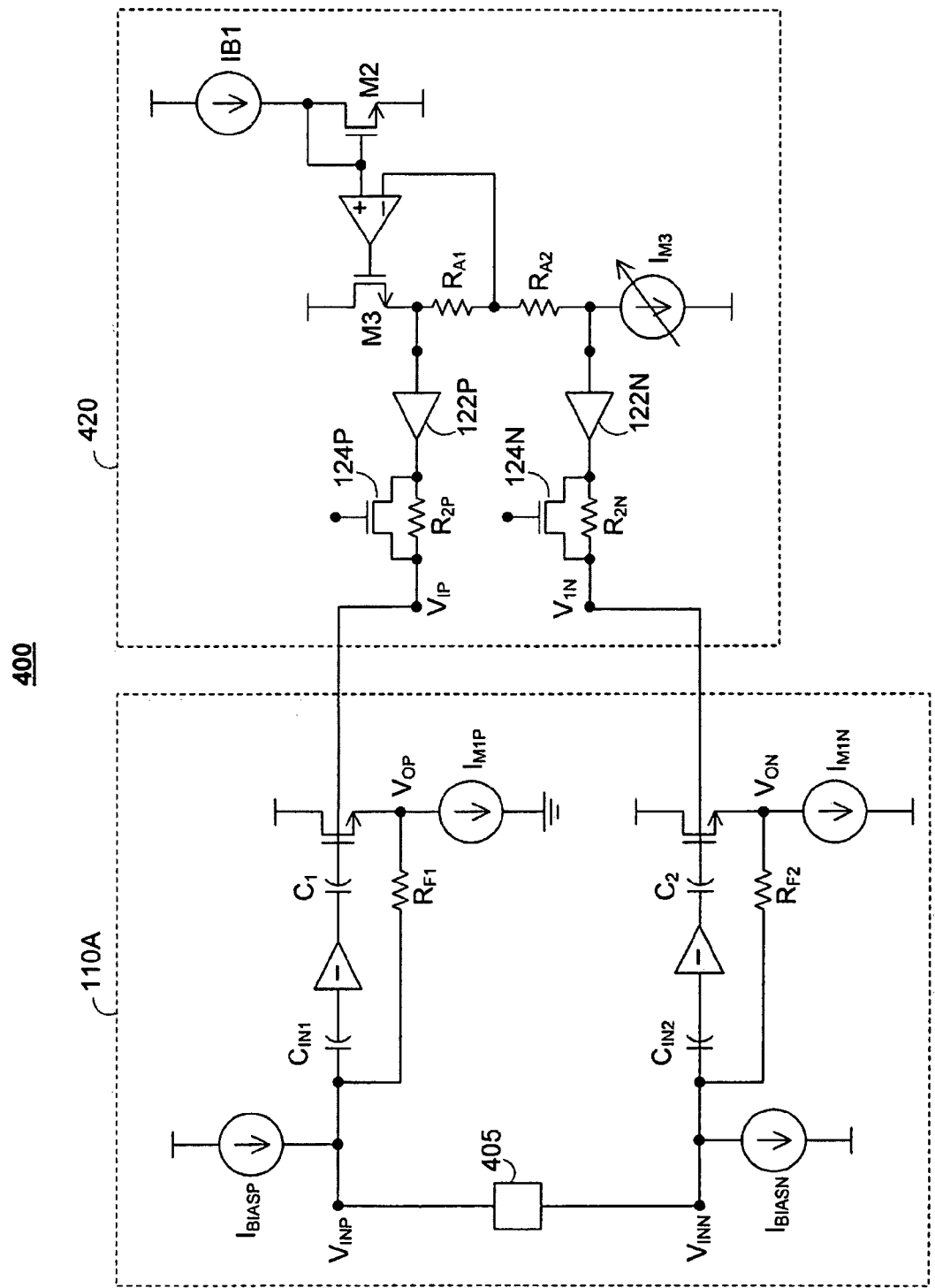
FIG. 4 shows a simplified diagram of a differential transimpedance feedback amplifier having open-loop DC control in accordance with some aspects of the present invention.

FIG. 4 shows differential transimpedance feedback amplifier 400 in accordance with some aspects of the present invention. Differential transimpedance feedback amplifier 400 is a differential version of transimpedance feedback amplifier 200 and operates in a substantially similar manner as transimpedance feedback amplifier 200. Differential transimpedance feedback amplifier 400 may be powered by positive and negative power supplies $V_{DD}$ and $V_{SS}$ and may provide differential outputs $V_{OP}$ and VON using DC bias voltages $V_{1P}$ and $V_{1N}$. Differential transimpedance feedback amplifier 400 also includes current sources $I_{BIASP}$, $I_{BIASN}$, $I_{M1P}$, $I_{M1N}$, $I_{M3}$, $I_{B1}$, resistors $R_{F1}$, $R_{F2}$, $R_{2P}$, and $R_{2N}$, capacitors $C_{IN1}$, $C_{IN2}$, $C_1$, and $C_2$, buffers 122P and 122N, and transistors 124P and 124N, which all operate in a substantially similar manner to their counterparts in transimpedance feedback amplifier 200.

Thus it is seen that a transimpedance feedback amplifier having open-loop DC control has been provided. It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. Control circuit for a transimpedance feedback amplifier, comprising:
   an input device;
   a transimpedance feedback amplifier in AC communication with the input device operative to generate an output signal; and
   an open-loop DC control circuit in DC communication with the transimpedance feedback amplifier operative to provide a DC bias voltage to the transimpedance feedback amplifier comprising a variable current source operative to adjust the DC bias voltage.

2. The control circuit of claim 1 wherein the DC bias voltage is substantially equal to a DC voltage of the input device.

3. The control circuit of claim 1 wherein the transimpedance feedback amplifier comprises a differential amplifier and the open-loop DC control circuit provides differential DC bias voltages to the transimpedance feedback amplifier.

4. The control circuit of claim 1 wherein the input device is selected from a group consisting of a photodiode and a magnetoresistor.

5. Control circuit for a transimpedance feedback amplifier, comprising:
   an input device;
   a transimpedance feedback amplifier in AC communication with the input device operative to generate an output signal; and
   an open-loop DC control circuit in DC communication with the transimpedance feedback amplifier operative to provide a DC bias voltage to the transimpedance feedback amplifier comprising a variable offset amplifier operative to adjust the DC bias voltage.

6. The control circuit of claim 5 wherein the DC bias voltage is substantially equal to a DC voltage of the input device.

7. The control circuit of claim 5 wherein the transimpedance feedback amplifier comprises a differential amplifier and the open-loop DC control circuit provides differential DC bias voltages to the transimpedance feedback amplifier.

8. The control circuit of claim 5 wherein the input device is selected from a group consisting of a photodiode and a magnetoresistor.

9. Control circuit for an amplifier, comprising:
   input means for receiving an input;
   amplifying means in AC communication with the input means operative to generate an output; and
   open-loop DC control means in DC communication with the amplifying means, operative to provide a DC bias voltage to the amplifying means, comprising a variable current source means operative to adjust the DC bias voltage.

10. The control circuit of claim 9 wherein the DC bias voltage is substantially equal to a DC voltage of the input means.

11. The control circuit of claim 9 wherein the amplifying means comprises differential amplifying means and the open-loop DC control means provides differential DC bias voltages to the amplifying means.

12. The control circuit of claim 9 wherein the input means is selected from a group consisting of photodetection means and magnetodetection means.

13. Control circuit for an amplifier, comprising:
   input means for receiving an input;
   amplifying means in AC communication with the input means, operative to generate an output; and
   open-loop DC control means in DC communication with the amplifying means, operative to provide a DC bias voltage to the amplifying means, comprising a variable offset amplifier means operative to adjust the DC bias voltage.

14. The control circuit of claim 13 wherein the DC bias voltage is substantially equal to a DC voltage of the input means.

15. The control circuit of claim 13 wherein the amplifying means comprises differential amplifying means and the open-loop DC control means provides differential DC bias voltages to the amplifying means.

16. The control circuit of claim 13 wherein the input means is selected from a group consisting of photodetection means and magnetodetection means.

17. A method for providing a control circuit for a transimpedance feedback amplifier, comprising:
   providing input to an input device;
   AC coupling a transimpedance feedback amplifier to the input device;
   generating an output signal using the transimpedance feedback amplifier;
   DC coupling an open-loop DC control circuit to the transimpedance feedback amplifier;
   generating a DC bias voltage using the open-loop DC control circuit;
   providing the DC bias voltage to the transimpedance feedback amplifier; and
   varying a variable offset amplifier in the open-loop DC control circuit to vary the DC bias voltage.

18. The method of claim 17 wherein the DC bias voltage is substantially equal to a DC voltage of the input device.

19. The method of claim 17 wherein the transimpedance feedback amplifier comprises a differential amplifier and the open-loop DC control circuit provides differential DC bias voltages to the transimpedance feedback amplifier.

20. The method of claim 17 wherein the input device is selected from a group consisting of a photodiode and a magnetoresistor.

* * * * *